(12) United States Patent
Huang et al.

(10) Patent No.: US 7,495,375 B2
(45) Date of Patent: Feb. 24, 2009

(54) POLARIZED LIGHT EMITTING DEVICE

(75) Inventors: Chen-Yang Huang, Taoyuan County (TW); Cheng-Wei Chu, Taipei Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 357 days.

(21) Appl. No.: 11/423,958

(22) Filed: Jun. 14, 2006

(65) Prior Publication Data

US 2007/0064407 A1    Mar. 22, 2007

(30) Foreign Application Priority Data

Sep. 19, 2005    (TW) .............................. 94132260 A (51) Int. Cl.
*H01J 5/16*    (2006.01)
(52) U.S. Cl. ...................................... 313/113; 313/512
(58) Field of Classification Search ................. 313/113, 313/498, 512
See application file for complete search history.

(56) References Cited

U.S. PATENT DOCUMENTS 5,813,753 A    9/1998    Vriens et al.
5,962,971 A    10/1999   Chen
2001/0010449 A1 *  8/2001  Chiu et al. ................... 313/501
2004/0080808 A1    4/2004  Kawakami et al.

FOREIGN PATENT DOCUMENTS

| CN | 1577902 | 2/2005 |
| JP | 2003279746 | 10/2003 |
| TW | 569467 | 1/2004 |
| TW | 569479 | 1/2004 |
| TW | I239671 | 9/2005 |

* cited by examiner

*Primary Examiner*—Vip Patel
(74) *Attorney, Agent, or Firm*—Jianq Chyun IP Office (57) ABSTRACT

A polarized light emitting device including a first reflector, an LED chip, a fluorescent layer, a second reflector and a polarizer with corrugation structure is provided. In the polarized light emitting device, the LED chip emits a first light (e.g. ultraviolet light) confined within a resonant chamber configured by the first reflector and the second reflector, therefore the fluorescent layer can be adequately illuminated by the first light, thus emitting more second light (visible light) and improving the electro-optical transforming efficiency. The second reflector is adapted for reflecting the first light, and allows most of the second light to pass through. The polarizer with corrugation structure disposed outside the resonant chamber is adapted for efficiently polarizing the second light.

26 Claims, 10 Drawing Sheets

POLARIZED LIGHT EMITTING DEVICE

CROSS-REFERENCE TO RELATED APPLICATION

This application claims the priority benefit of Taiwan application serial no. 94132260, filed on Sep. 19, 2005. All disclosure of the Taiwan application is incorporated herein by reference.

BACKGROUND OF THE INVENTION

1. Field of the Invention

The present invention relates to a light emitting device, and particularly to a polarized light emitting device.

2. Description of Related Art

In recent years, light emitting diodes (LEDs) have gradually improved the light emitting efficiency and replacing fluorescent lamps and incandescent lamps in some fields, including highly responsive speed lamps for scanners, backlight sources or front light sources for liquid crystal displays (LCDs), light sources for instrument panel of automobiles, traffic signal lamps, light sources for projection devices and even ordinary illumination devices. Typical LEDs are usually semiconductor devices using III-V compounds, such as GaP, GaAs. LEDs convert electrical energy into light. As the current is applied to a typical compound LED, through the combination of the electron and electron hole, excessive energy is released in the form of light. The light emission of LEDs is typically cold light emission, rather than by heat or discharge, therefore LEDs often have relatively long operating lifetime of up to 100,000 hours, and with no idling time required. LEDs also have such advantages as faster responsive speed (about $10^{-9}$ S), smaller size, lower power consumption, lower contamination, higher reliability, capability for mass production. Accordingly, LEDs are wildly used in many fields.

Take the projector as an example, LEDs that have longer life span are used inside its light system. As disclosed by U.S. Pat. Nos. 5,962,971, 5,813,753, TW Patent No. 569,467 and TW Patent Application No.93141534, LEDs can be used in light source systems for projector. The conventional technologies disclosed in the foregoing publications are generally about using ultraviolet (UV) filters, long wave/short wave pass filters, pseudo omni-directional reflectors or omni-directional reflectors for improving total light emitting efficiencies thereof. However, how to polarize light provided by the LEDs are not yet disclosed.

SUMMARY OF THE INVENTION

The invention is directed to provide a polarized light emitting device having better light emitting efficiency.

The invention is directed to provide a polarized light emitting device having better polarizing efficiency.

The present invention provides a polarized light emitting device. The polarized light emitting device includes a first reflector, an LED chip, a fluorescent layer, a second reflector and a polarizer with courragation structure. The LED chip is disposed on the first reflector, and is adapted for emitting a first light. The fluorescent layer is disposed in the first reflector for covering the LED chip. The fluorescent layer is adapted for emitting a second light when illuminated by the first light. The first reflector and the second reflector configure a resonant chamber enclosing the LED chip and the fluorescent layer. The first reflector is adapted for reflecting the first light and the second light, while the second reflector is adapted for reflecting the first light and allowing the second light to pass through. The polarizer with courragation structure is disposed outside the resonant chamber and on a transmitting path of the second light, for polarizing the second light passing through the second reflector.

The present invention provides a polarized light emitting device. The polarized light emitting device includes a reflector, an LED chip, a fluorescent layer, a second reflector and a polarizer with courragation structure. The LED chip is disposed on the reflector, and is adapted for emitting a first light. The fluorescent layer is disposed in the first reflector for covering the LED chip. The fluorescent layer is adapted for emitting a second light when illuminated by the first light. The reflector is adapted for reflecting the first light and the second light. The polarizer with courragation structure is disposed on a transmitting path of the second light, for polarizing the second light.

According to an embodiment of the invention, the first reflector for example is a metal reflector, an omni-directional reflector or a pseudo omni-directional reflector, and the second reflector for example is an omni-directional reflector or a pseudo omni-directional reflector.

According to an embodiment of the invention, the fluorescent layer includes an encapsulant and a fluorescent material. The encapsulant is disposed in the second reflector for covering the LED chip. The fluorescent material is distributed in the encapsulant. The LED chip for example is an ultraviolet LED chip, and the fluorescent material for example includes a red fluorescent material, a green fluorescent material, and/or a blue fluorescent material. Further, the LED chip can also be a blue LED chip and the fluorescent material can also be a yellow fluorescent material.

According to an aspect of the embodiment of the invention, the polarizer with courragation structure can be disposed on the second reflector and for example can be a photonic crystal polarizer with courragation structure. The polarizer with courragation structure for example includes a common substrate, a plurality of first optical thin films and a plurality of second optical thin films. The common substrate has a first surface and a second surface. The first surface has periodically alternating convex-concave structure configured thereon. The first optical thin films and the second optical thin films are alternately stacked on each other and disposed on the first surface of the common substrate. The first optical thin films and the second optical thin films are different in their optical refractive index. The second reflector includes a plurality of third optical thin films and a plurality of fourth optical thin films. The third optical thin films and the fourth optical thin films are alternately stacked on each other and disposed on the second surface of the common substrate. The third optical thin films and the fourth optical thin films are different in their optical refractive index. However, according to another aspect of the embodiment of the invention, the polarizer with courragation structure and the second reflector can also be respectively formed on different substrates.

According to an embodiment of the invention, the material of the first optical thin film for example comprises $TiO_2$, $Ta_2O_5$, $Nb_2O_5$, $CeO_2$ or $ZnS$, and the material of the second optical thin film for example comprises $SiO_2$, or $MgF_2$. The material of the third optical thin film for example comprises $TiO_2$, $Ta_2O_5$, $Nb_2O_5$, $CeO_2$ or $ZnS$, and the material of the fourth optical thin film for example comprises $SiO_2$, or $MgF_2$.

According an embodiment of the invention, the polarizer with courragation structure is disposed above the second reflector, and is preferably connected with the first reflector above the second reflector.

According an embodiment of the invention, the polarized light emitting device for example further includes a lens disposed between the second reflector and the polarizer with courragation structure.

BRIEF DESCRIPTION OF THE DRAWING

The features of the invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DESCRIPTION OF THE EMBODIMENTS

The First Embodiment

Figure 1:
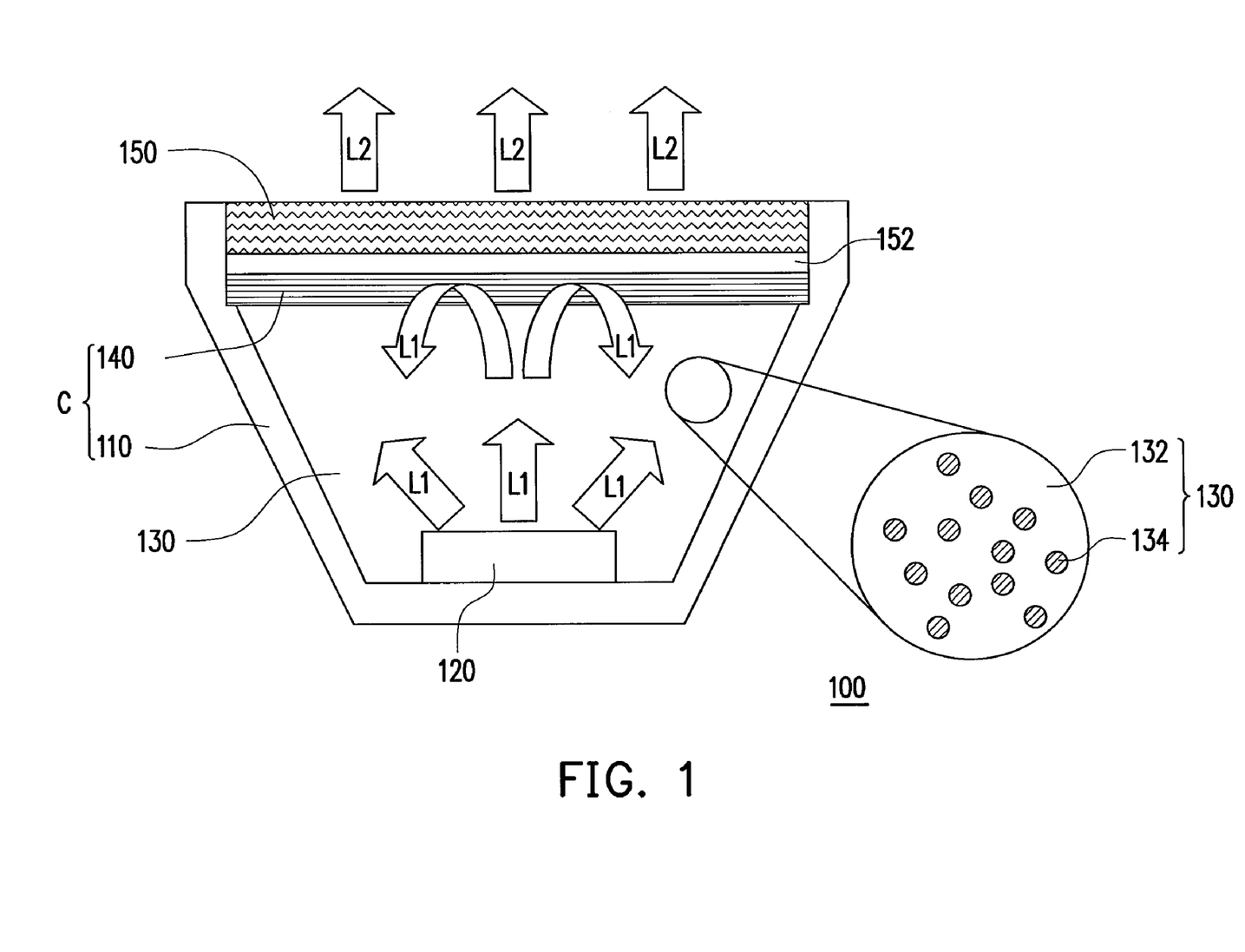
FIG. 1 is a schematic view for illustrating the polarized light emitting device according to the first embodiment of the present invention.

FIG. 1 is a schematic view for illustrating the polarized light emitting device according to the first embodiment of the present invention. Referring to FIG. 1, the polarized light emitting device 100 includes a first reflector 110, an LED chip 120, a fluorescent layer 130, a second reflector 140 and a polarizer 150 with courragation structure. The LED chip 120 is disposed on the first reflector 110, and is adapted for emitting a first light L1. The fluorescent layer 130 is disposed in the first reflector 110 for covering the LED chip 120. The fluorescent layer 130 is adapted for emitting a second light L2 when illuminated by the first light L1. The first reflector 110 and the second reflector 140 configure a resonant chamber C enclosing the LED chip 120 and the fluorescent layer 130. The first reflector 110 is adapted for reflecting the first light L1 and the second light L2, while the second reflector 140 is adapted for reflecting the first light L1 and allowing the second light L2 to pass through. The polarizer 150 with courragation structure is disposed outside the resonant chamber C and on a transmitting path of the second light L2, for polarizing the second light L2 passing through the second reflector 140.

According to the embodiment, the first reflector 110 can be a metal reflector for reflecting the first light L1 and the second light L2. The first reflector 110 can also be an omni-directional reflector or a pseudo omni-directional reflector or other reflective devices highly reflective to the first light L1.

As shown in FIG. 1, the resonant chamber C of the embodiment has the first light L1 limited within a specified space (i.e. the space defined by the resonant chamber). Ideally, the resonant chamber C allows only the second light L2 to pass though and allows no first light L1 to pass though. In order to obtain an ideal resonant chamber C, an omni-directional reflector or a pseudo omni-directional reflector or other reflective device highly reflective to the first light L1 and highly transmissive to the second light L2 is employed as the second reflector 140.

Referring to FIG. 1, the fluorescent layer 130 includes an encapsulant 132 and a fluorescent material 134. The encapsulant 132 is disposed in the second reflector 140 for covering the LED chip 120. The fluorescent material 134 is disposed in the encapsulant 132. In the embodiment, the LED chip 120 and the fluorescent material 134 can be selected in accordance with the color light obtained. For example, if the polarized light emitting device 100 is adapted for providing a white light, the LED chip 120 can correspondingly be an ultraviolet LED chip and the fluorescent material 134 can correspondingly be a red fluorescent material, a green fluorescent material, and/or a blue fluorescent material. As the LED chip is a blue LED chip and the fluorescent material is a yellow fluorescent material, the polarized light emitting device 100 can also be a white light emitting device. In another hand, if the polarized light emitting device 100 is adapted for providing color light other than white light, such as red light, green light and blue light, an ultraviolet LED chip cooperating with a red fluorescent material, a green fluorescent material, or a blue fluorescent material can be adopted for generating red light, green light or blue light with appropriate color temperature.

As shown in FIG. 1, the polarizer 150 with courragation structure according to the embodiment, can be directly disposed on the second reflector 140, and the first reflector 110 for example has a cup-shape structure. The polarizer 150 with courragation structure and the second reflector 140 are connected with an upper edge of the first reflector 110. However, the polarizer 150 with courragation structure can also be disposed outside the resonant chamber C, where the second light L2 passing through the second reflector 140 can be polarized. In details, the polarizer 150 with courragation structure allows a part of the second light L2 of TM mode to pass through, and reflects a part of the second light L2 of TE mode.

Figure 2:
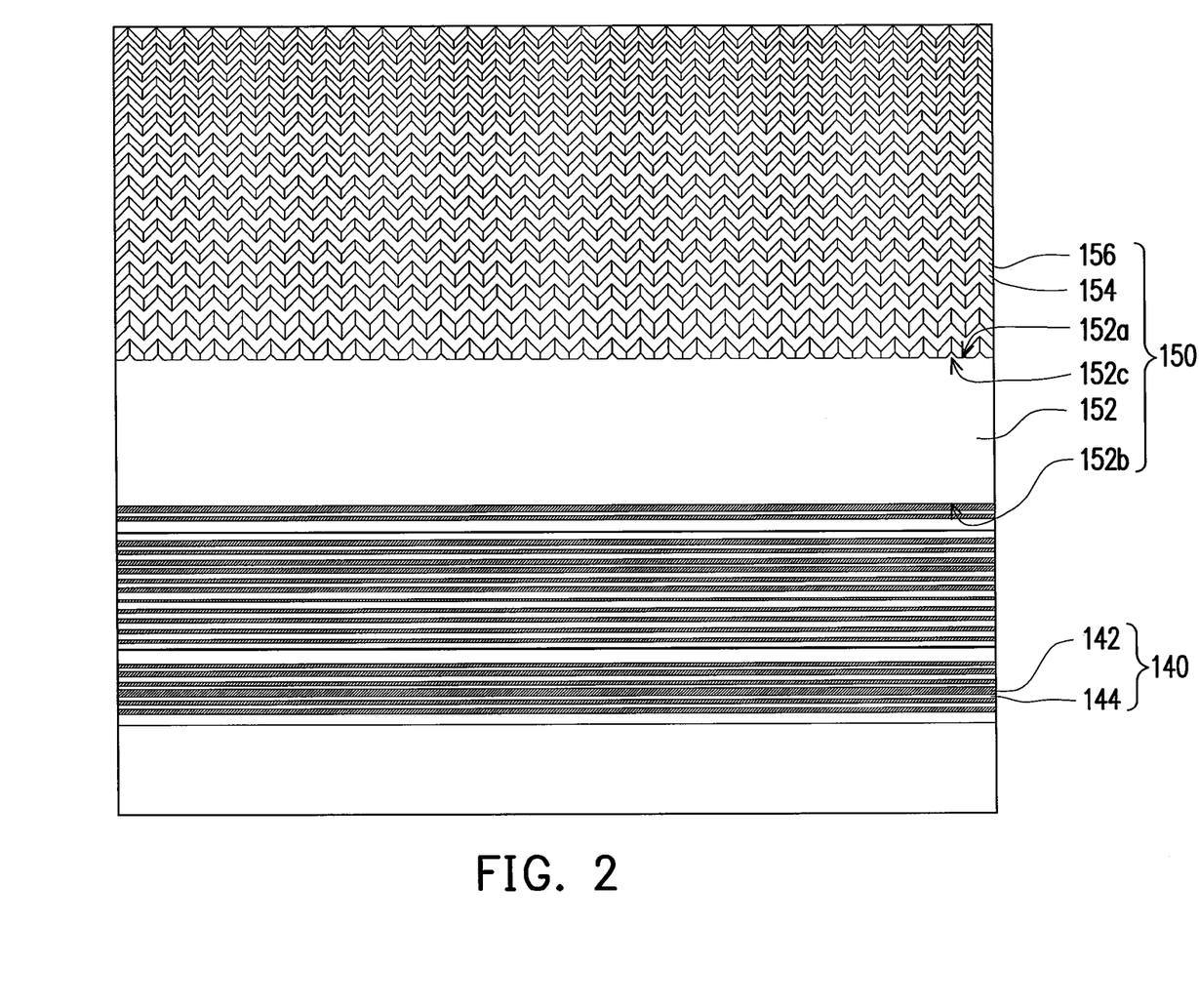
FIG. 2 is a schematic view of a polarizer with courragation structure and a second reflector according to FIG. 1.
Figure 3:
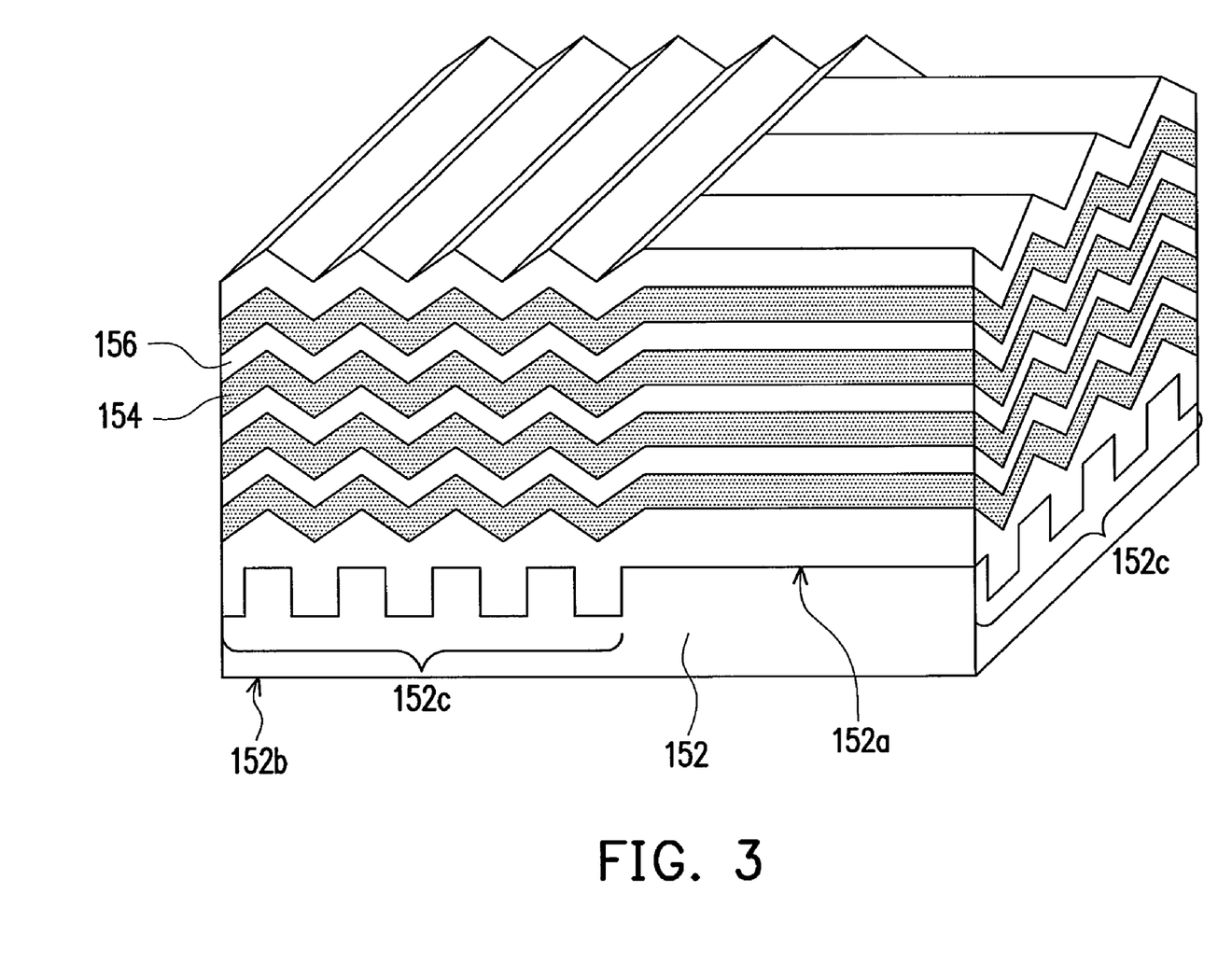
FIG. 3 is a schematic view of the polarizer with courragation structure according to FIG. 1.

FIG. 2 is a schematic view of a polarizer with courragation structure and a second reflector according to FIG. 1. FIG. 3 is a schematic view of the polarizer with courragation structure according to FIG. 1. Referring to FIGS. 1, 2 and 3, the polarizer 150 with courragation structure of the embodiment for example is a photonic crystal polarizer with courragation structure. As shown in FIGS. 2 and 3, the polarizer 150 with courragation structure according to the embodiment includes a common substrate 152, a plurality of first optical thin films 154 and a plurality of second optical thin films 156. The common substrate 152 has a first surface 152a and a second surface 152b. The first surface 152a has a periodically alternating convex-concave structure 152c configured thereon.

Generally, the periodically alternating convex-concave structure 152c can be made by a photolithographic process with an etching process, a nano-imprinting process or a micro-contact process. The periodically alternating convex-concave structure c152c can be distributed in a shape of triangular, a hexagon or a quadrangle.

The first optical thin films 154 and the second optical thin films 156 are alternately stacked on each other and disposed on the first surface 152a of the common substrate 152. The first optical thin films 154 and the second optical thin films 156 are different in their optical refractive index. The material of the first optical thin film for example comprises $TiO_2$, $Ta_2O_5$, $Nb_2O_5$, $CeO_2$ or ZnS, and the material of the second optical thin film for example comprises $SiO_2$, or $MgF_2$.

As shown in FIGS. 1 and 2, the second reflector 140 is formed on the common substrate 152 of the polarizer 150 with courragation structure. The second reflector 140 includes a plurality of third optical thin films 142 and a plurality of fourth optical thin films 144. The third optical thin films 142 and the fourth optical thin films 144 are alternately stacked on each other and disposed on the second surface 152b of the common substrate 150. The third optical thin films 142 and the fourth optical thin films 144 are different in their optical refractive index. The material of the third optical thin film for example comprises $TiO_2$, $Ta_2O_5$, $Nb_2O_5$, $CeO_2$ or ZnS, and the material of the fourth optical thin film for example comprises $SiO_2$, or $MgF_2$. The first optical thin films 154, the second optical thin films 156, the third optical thin films 142 and the fourth optical thin films 144 are for example made in an optical thin film coating method, such as a dual ion beam sputtering (DIBS) method, a magnetron sputtering method or an ion assisted coating method.

The Second Embodiment

Figure 4:
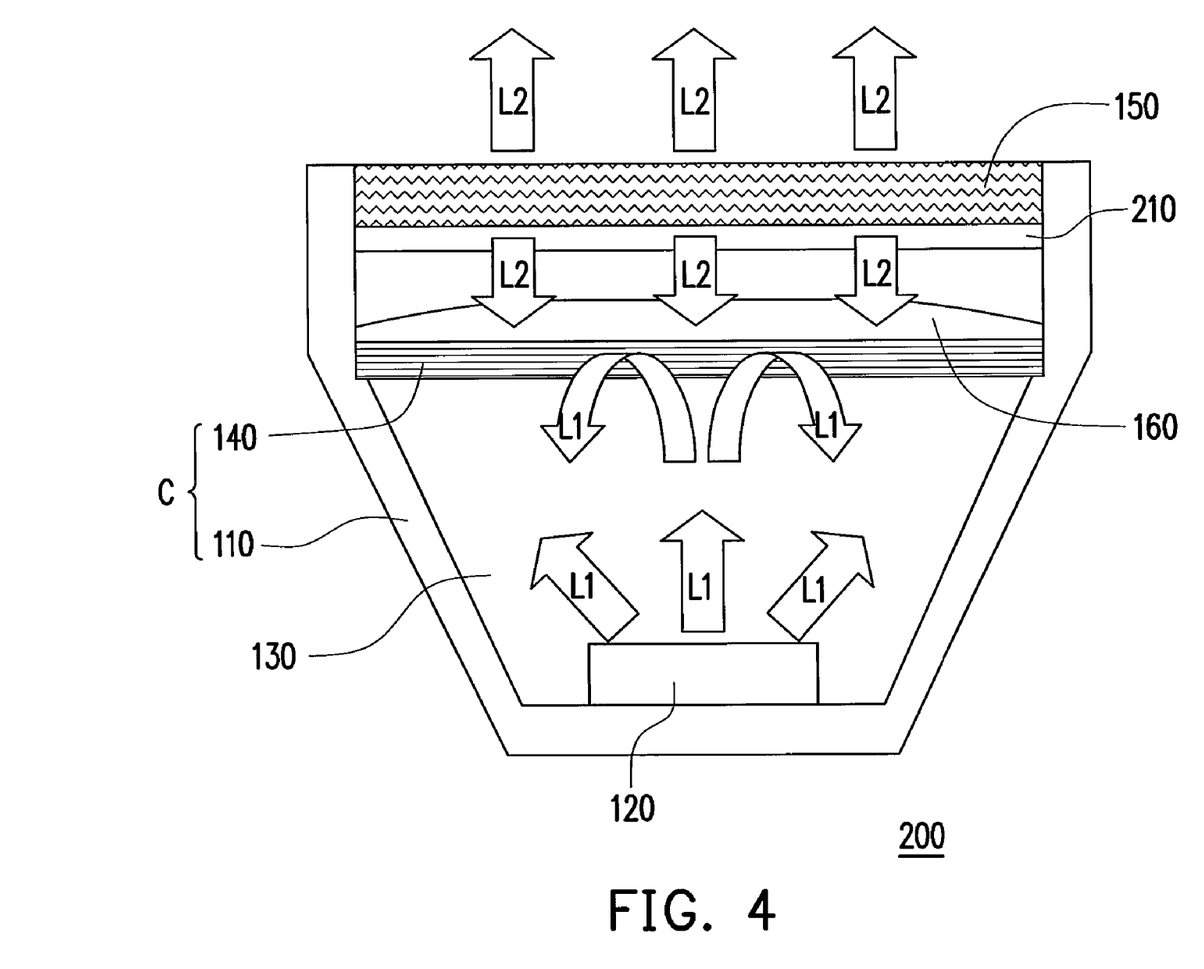
FIG. 4 is a schematic view for illustrating the polarized light emitting device according to the second embodiment of the present invention.
Figure 5:
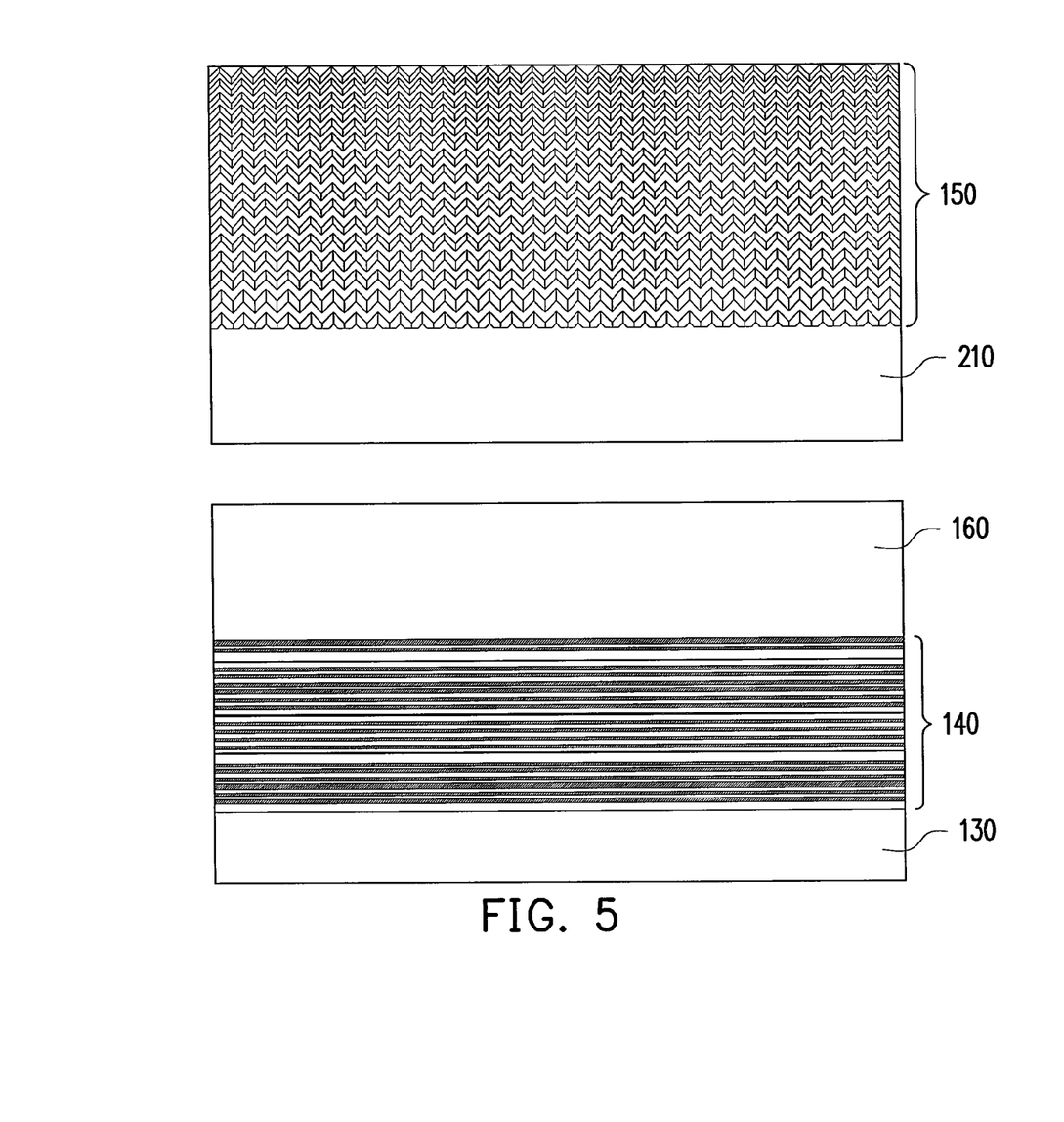
FIG. 5 is a schematic view of a polarizer with courragation structure, a lens and a second reflector according to FIG. 4.

FIG. 4 is a schematic view for illustrating the polarized light emitting device according to the second embodiment of the present invention. FIG. 5 is a schematic view of a polarizer with courragation structure, a lens and a second reflector according to FIG. 4. Referring to FIGS. 4 and 5, the polarized light emitting device 200 is similar to the polarized light emitting device 100 of the first embodiment shown in FIG. 1. However, the difference is that the polarizer 150 with courragation structure of the second embodiment is disposed above the second reflector 140. In other words, the second reflector 140 and the polarizer 150 with courragation structure are formed respectively on different substrates. As shown in FIG. 4, the first reflector 110 for example has a cup-shape structure. The second reflector 140 and the polarizer 150 with courragation structure are connected by an upper edge of the first reflector 110.

Further, in order to have better light collimation, the polarized light emitting device 200 can further includes a lens 160. The lens 160 is preferably disposed between the second reflector 140 and the polarizer 150 with courragation structure. Specifically, the second reflector 140 may be formed on the surface of the lens 160. In other words, the lens 160 serves as a substrate for fabricating the second reflector 140. In addition, the lens 160 can also be disposed at other positions, such as on or above the polarizer 150 with courragation structure.

Figure 6:
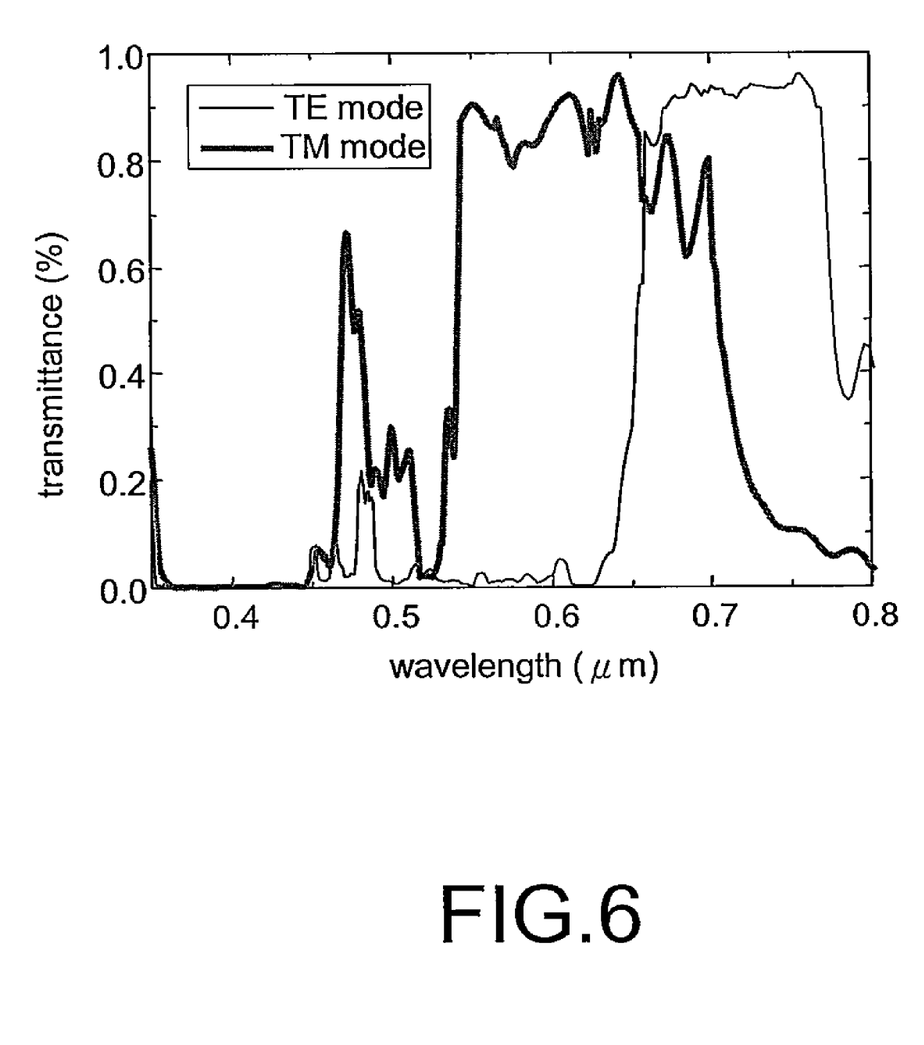
FIG. 6 is an optical spectrum diagram of the polarized light emitting device according to the present invention.

FIG. 6 is an optical spectrum diagram of the polarized light emitting device 200 according to the present invention. The exemplary light emitting device 200 illustrated herein includes an LED chip 120 that is an ultraviolet LED chip having a central wavelength of 385 nm, a polarizer 150 with courragation structure that is a photonic crystal polarizer with courragation structure having 15 pairs of $TiO_2/SiO_2$ optical films (totally 30 layers), and a second reflector 140 that is a pseudo omni-directional reflector having 21 pairs of $TiO_2/SiO_2$ optical films (totally 42 layers). Referring to FIG. 6, the light of TM mode has a reflectivity greater than 99% in the wavelength range from 359 nm to 448 nm, and has a transmittance ratio greater than 85% in the wavelength range from 540 nm to 700 nm. In general, lights of wavelength from 359 mn to 448 mn are substantially total reflected, while lights of wavelength from 540 nm to 630 nm are mostly polarized, wherein the polarizing efficiency of the light is greater than 1000. Here, the polarizing efficiency is a ratio of the light of TE mode and the light of TM mode.

Figure 7:
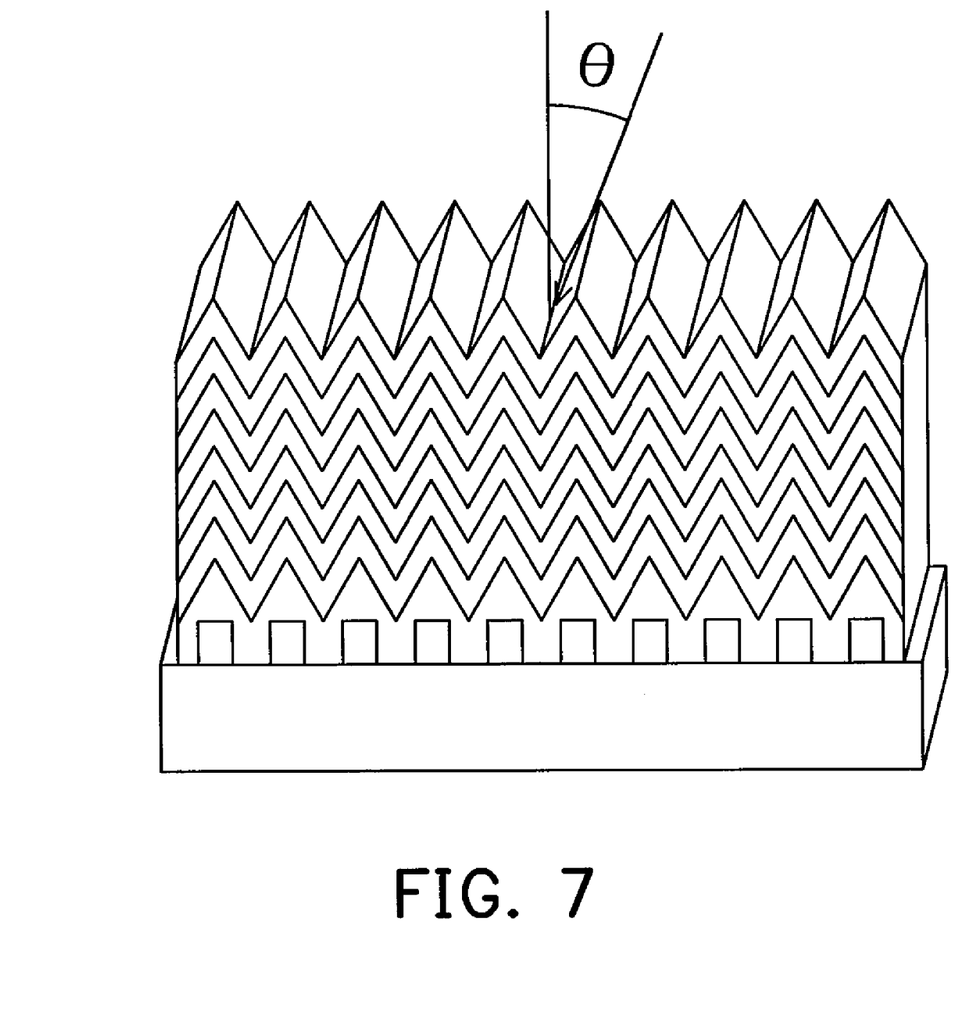
FIG. 7 is a schematic diagram showing a normal vector and an incident light having an incident angle θ, of a photonic crystal polarizer with courragation structure.
Figure 8A:
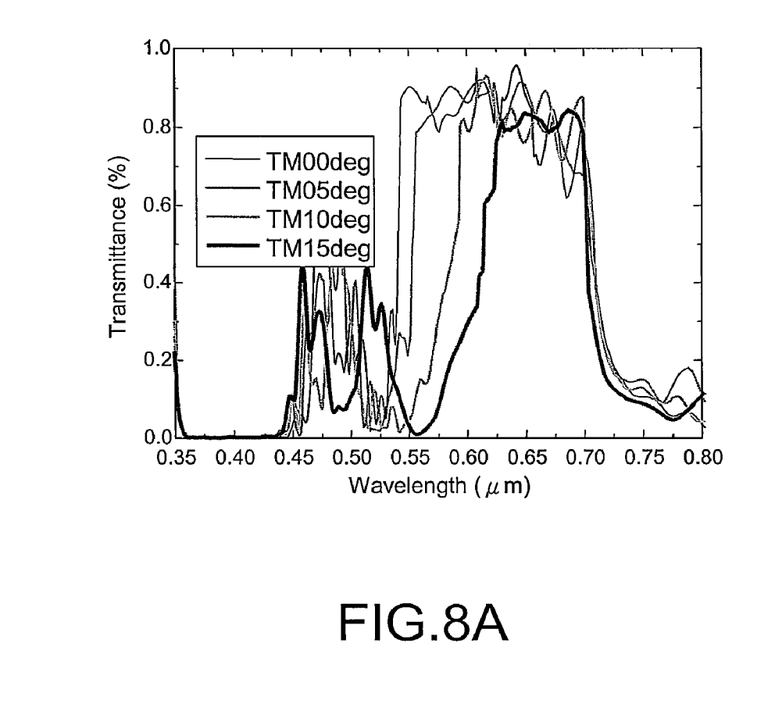
FIG. 8A is an optical spectrum diagram of TM mode according to a different incident angle θ.
Figure 8B:
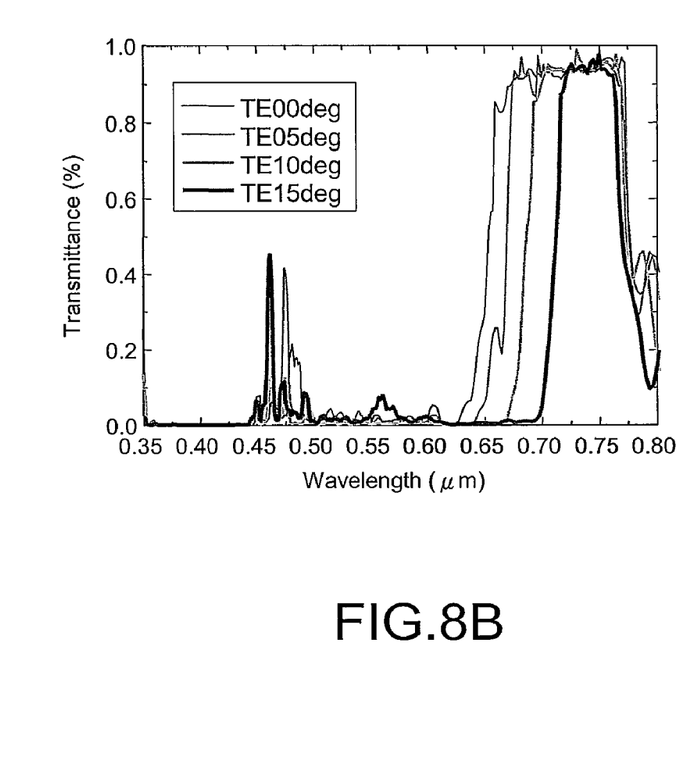
FIG. 8B is an optical spectrum diagram of TE mode according to a different incident angle θ.

FIG. 7 is a schematic diagram showing a normal vector and an incident light having an incident angle of θ, of a photonic crystal polarizer with courragation structure. FIG. 8A is an optical spectrum diagram of TM mode according to a different incident angle of θ. FIG. 8B is an optical spectrum diagram of TE mode according to a different incident angle of θ. Referring to FIGS. 7, 8A and 8B, it can be known that when an incident angle θ of an incident light to the photonic crystal polarizer with courragation structure changes, the wavelength ranges in which the lights are to be total reflected or polarized may also change to some degree. However, the change of the incident angle θ has little effect on the light emitting efficiency and polarizing efficiency.

The Third Embodiment

Figure 9:
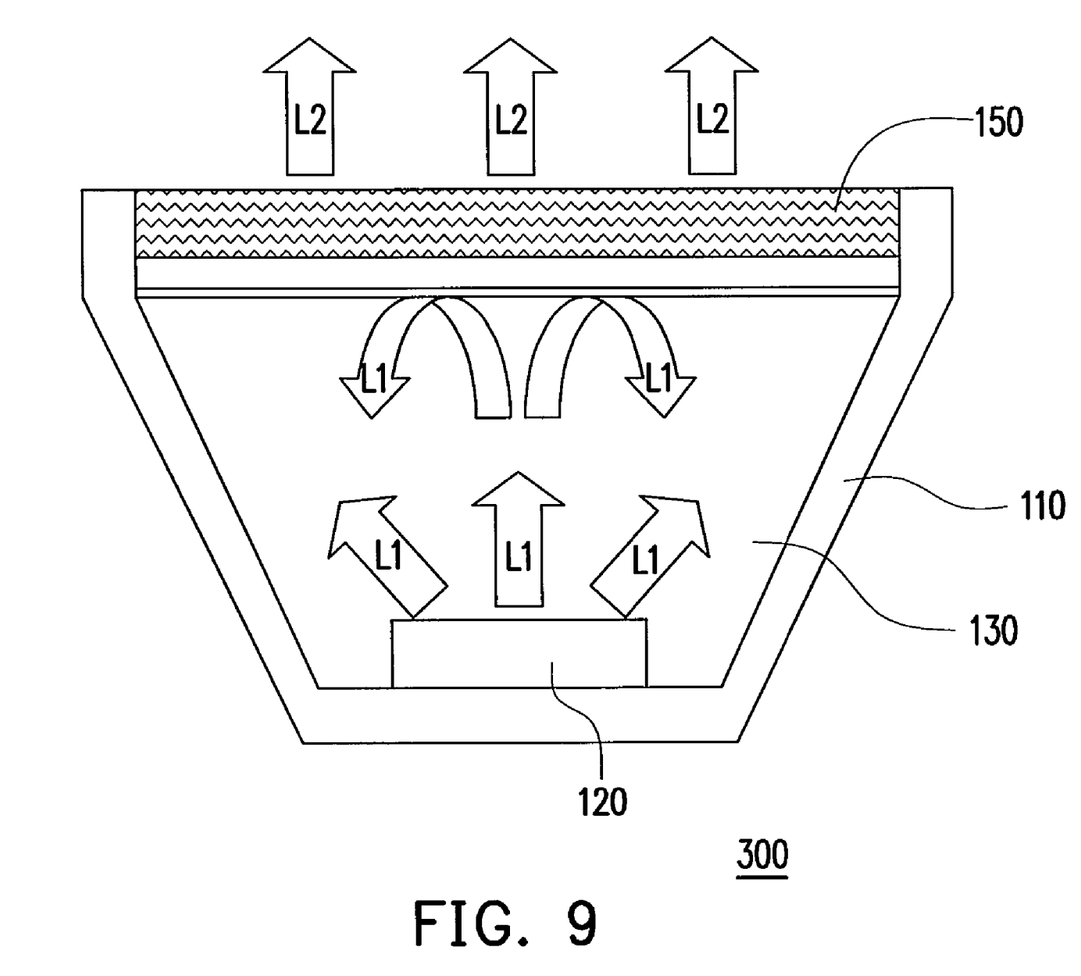
FIG. 9 is a schematic view for illustrating the polarized light emitting device according to the third embodiment of the present invention.

FIG. 9 is a schematic view for illustrating a polarized light emitting device 300 according to the third embodiment of the present invention. Referring to FIG. 9, the polarized light emitting device 300 includes a reflector 110, an LED chip 120, a fluorescent layer 130 and a polarizer 150 with courragation structure. The LED chip 120 is disposed on the reflector 110, and is adapted for emitting a first light L1. The fluorescent layer 130 is disposed in the reflector 110 for covering the LED chip 120. The fluorescent layer 130 is adapted for emitting a second light L2 when illuminated by the first light L1. The reflector 110 is adapted for reflecting the first light L1 and the second light L2. The polarizer 150 with courragation structure is disposed on a transmitting path of the second light L2, for polarizing the second light L2.

Even though the polarized light emitting device 300 does not include a resonant chamber as disclosed according to the first embodiment and the second embodiment, it is also adapted for polarizing light. Because reflected lights of TE mode are recyclable and reusable, the polarized light emitting device 300 has a relatively high light emitting efficiency.

The Fourth Embodiment

Figure 10:
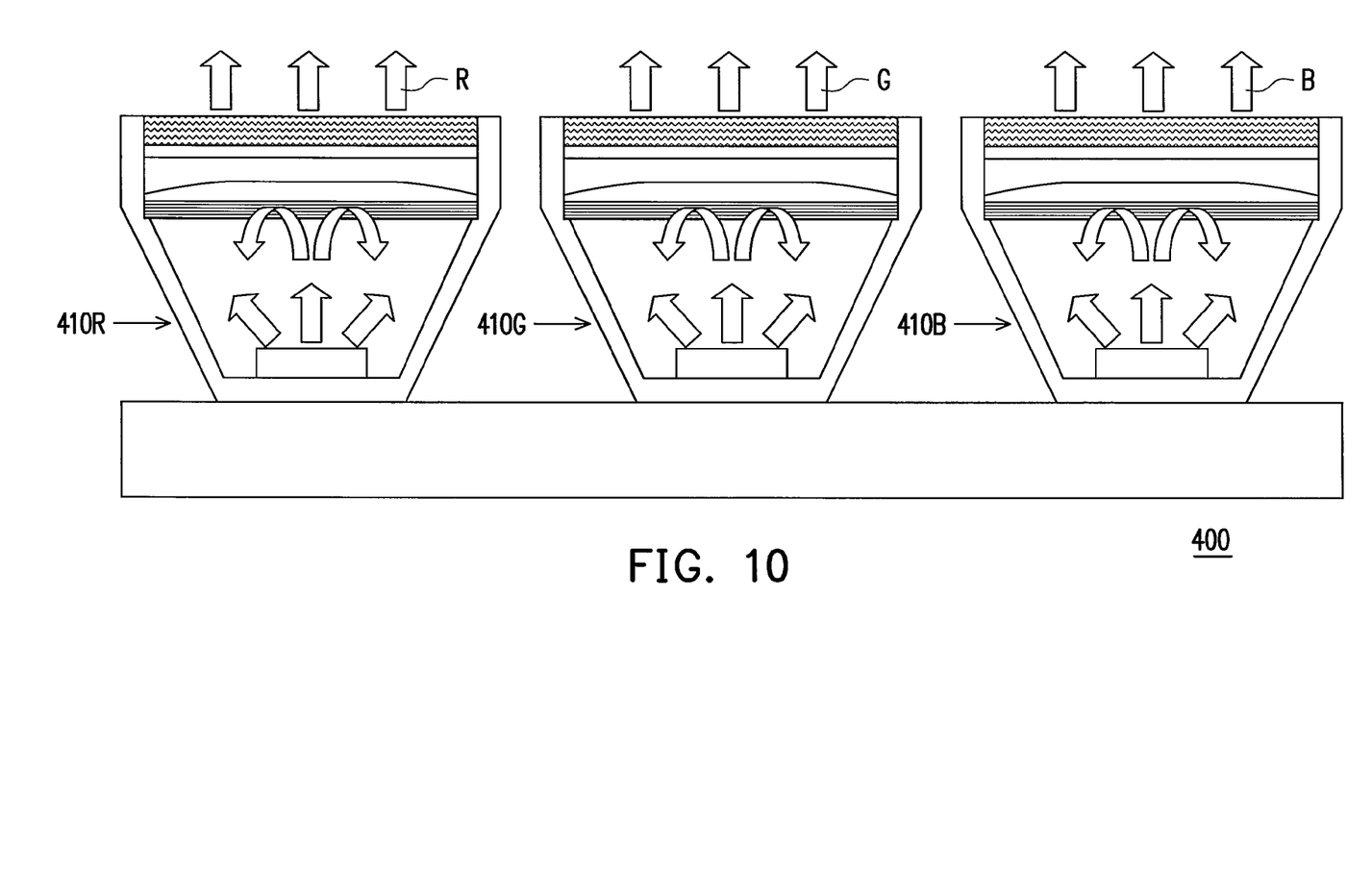
FIG. 10 is a schematic diagram for illustrating an array of the polarized light emitting devices according to the fourth embodiment of the present invention.

FIG. 10 is a schematic diagram for illustrating an array 400 of the polarized light emitting devices according to the fourth embodiment of the present invention. Referring to FIG. 10, the array 400 includes a plurality of polarized light emitting devices 410R, 410G, 410B. The polarized light emitting devices 410R, 410G, 410B have structures as shown in FIG. 1, 4 or 9.

The polarized light emitting device 410R is adapted for emitting a red light R; the polarized light emitting device 410G is adapted for emitting a green light G; and the polarized light emitting device 410B is adapted for emitting a blue light B. Accordingly, the array 400 of polarized light emitting devices 410R, 410G, 410B is adapted for providing white lights having appropriate color temperatures. In details, the polarized light emitting device 410R for example adopts a red fluorescent material and an ultraviolet LED for generating the red light R; the polarized light emitting device 410G for example adopts a green fluorescent material and an ultraviolet LED for generating the red light G; and the polarized light emitting device 410B for example adopts a blue fluorescent material and an ultraviolet LED for generating the red light B.

In summary, the polarized light emitting device according to the present invention has at least the following advantages:

1. The present invention integrates the polarizer having courragation structure with at least one reflector, for using ultraviolet lights to generate second-time visible fluorescent lights, thus improving light emitting efficiency;
2. According to the polarized light emitting device of the invention, the light of TE mode reflected by the polarizer with courragation structure is recyclable and reusable, and therefore the polarized light emitting device has a relatively high light emitting efficiency;
3. The polarized light emitting device of the invention can be used in products using polarized lights such as projectors.

Other modifications and adaptations of the above-described preferred embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

What is claimed is:

1. A polarized light emitting device, comprising:
    a first reflector;
    an LED chip, disposed on the first reflector for emitting a first light;
    a fluorescent layer, disposed in the first reflector for covering the LED chip, the fluorescent layer being adapted for emitting a second light when illuminated by the first light;
    a second reflector, configuring a resonant chamber enclosing the LED chip and the fluorescent layer with the first reflector, wherein the first reflector is adapted for reflecting the first light and the second light, and the second reflector is adapted for reflecting the first light and allowing the second light to pass through; and
    a polarizer with corrugation structure, disposed outside the resonant chamber and on a transmitting path of the second light, for polarizing the second light passing through the second reflector.

2. The polarized light emitting device according to claim 1, wherein the first reflector is a metal reflector, an omni-directional reflector or a pseudo omni-directional reflector.

3. The polarized light emitting device according to claim 1, wherein the fluorescent layer comprises:
    an encapsulant, disposed in the second reflector for covering the LED chip; and
    a fluorescent material, distributed in the encapsulant.

4. The polarized light emitting device according to claim 3, wherein the LED chip is an ultraviolet LED chip, and the fluorescent material comprises a red fluorescent material, a green fluorescent material, and/or a blue fluorescent material.

5. The polarized light emitting device according to claim 3, wherein the LED chip comprises a blue LED chip and the fluorescent material comprises a yellow fluorescent material.

6. The polarized light emitting device according to claim 1, wherein the second reflector is an omni-directional reflector or a pseudo omni-directional reflector.

7. The polarized light emitting device according to claim 1, wherein the polarizer with corrugation structure is disposed on the second reflector.

8. The polarized light emitting device according to claim 7, wherein the polarizer with corrugation structure is a photonic crystal polarizer with corrugation structure.

9. The polarized light emitting device according to claim 7, wherein the polarizer with corrugation structure comprises:
    a common substrate having a first surface and a second surface, the first surface having periodically alternating convex-concave structure configured thereon;
    a plurality of first optical thin films; and
    a plurality of second optical thin films, wherein the first optical thin films and the second optical thin films are alternately stacked on each other and disposed on the first surface of the common substrate, and the first optical thin films and the second optical thin films are different in optical refractive index.

10. The polarized light emitting device according to claim 9, wherein a material of the first optical thin films comprises $TiO_2$, $Ta_2O_5$, $Nb_2O_5$, $CeO_2$ or $ZnS$, and a material of the second optical thin film comprises $SiO_2$, or $MgF_2$.

11. The polarized light emitting device according to claim 9, wherein the second reflector comprises:
    a plurality of third optical thin films; and
    a plurality of fourth optical thin films, wherein the third optical thin films and the fourth optical thin films are alternately stacked on each other and disposed on the second surface of the common substrate, and the third optical thin films and the fourth optical thin films are different in optical refractive index.

12. The polarized light emitting device according to claim 11, wherein a material of the third optical thin films comprises $TiO_2$, $Ta_2O_5$, $Nb_2O_5$, $CeO_2$ or $ZnS$, and a material of the fourth optical thin films comprises $SiO_2$, or $MgF_2$.

13. The polarized light emitting device according to claim 1, wherein the polarizer with corrugation structure is disposed above the second reflector.

14. The polarized light emitting device according to claim 13, further comprising a lens disposed between the second reflector and the polarizer with corrugation structure.

15. The polarized light emitting device according to claim 13, wherein the polarizer with corrugation structure is a photonic crystal polarizer with corrugation structure.

16. The polarized light emitting device according to claim 13, wherein the polarizer with corrugation structure comprising:
    a first substrate having a periodically alternating convex-concave structure configured thereon;
    a plurality of first optical thin films; and
    a plurality of second optical thin films, wherein the first optical thin films and the second optical thin films are alternately stacked on each other and disposed on the first surface of the common substrate, and the first optical thin films and the second optical thin films are different in optical refractive index.

17. The polarized light emitting device according to claim 16, wherein a material of the first optical thin films comprises $TiO_2$, $Ta_2O_5$, $Nb_2O_5$, $CeO_2$ or $ZnS$, and a material of the second optical thin film comprises $SiO2$, or $MgF2$.

18. The polarized light emitting device according to claim 13, wherein the polarizer with corrugation structure comprises:
    a plurality of third optical thin films; and
    a plurality of fourth optical thin films, wherein the third optical thin films and the fourth optical thin films are alternately stacked on each other, and the third optical thin films and the fourth optical thin films are different in optical refractive index.

19. The polarized light emitting device according to claim 18, wherein a material of the third optical thin films comprises $TiO_2$, $Ta_2O_5$, $Nb_2O_5$, $CeO_2$ or $ZnS$, and a material of the fourth optical thin films comprises $SiO_2$, or $MgF_2$.

20. The polarized light emitting device according to claim 13, wherein the polarizer with corrugation structure is connected with the first reflector above the second reflector.

21. An polarized light emitting device, comprising:
a reflector;
a LED chip, disposed on the reflector for emitting a first light;
a fluorescent layer, disposed in the reflector for covering the LED chip, the fluorescent layer being adapted for emitting a second light when illuminated by the first light, wherein the first light and the second light are adapted to be reflected by the reflector; and
a polarizer with corrugation structure, disposed on a transmitting path of the second light, for polarizing the second light.

22. The polarized light emitting device according to claim 21, wherein the reflector is a metal reflector, an omni-directional reflector or a pseudo omni-directional reflector.

23. The polarized light emitting device according to claim 21, wherein the fluorescent layer comprises:
an encapsulant, disposed in the reflector for covering the LED chip; and
a fluorescent material, distributed in the encapsulant.

24. The polarized light emitting device according to claim 23, wherein the LED chip is an ultraviolet LED chip, and the fluorescent material comprises a red fluorescent material, a green fluorescent material, and/or a blue fluorescent material.

25. The polarized light emitting device according to claim 23, wherein the LED chip comprises a blue LED chip and the fluorescent material comprises a yellow fluorescent material.

26. The polarized light emitting device according to claim 21, wherein the polarizer with corrugation structure is a photonic crystal polarizer with corrugation structure.

* * * * *